United States Patent
Chen et al.

(10) Patent No.: US 10,872,868 B2
(45) Date of Patent: *Dec. 22, 2020

(54) FAN-OUT ANTENNA PACKAGING STRUCTURE AND PREPARATION METHOD THEREOF

(71) Applicant: SJ Semiconductor (Jiangyin) Corporation, Jiangyin (CN)

(72) Inventors: Yenheng Chen, Jiangyin (CN); Chengchung Lin, Jiangyin (CN); Jangshen Lin, Jiangyin (CN); Chengtar Wu, Jiangyin (CN); Chihon Ho, Jiangyin (CN)

(73) Assignee: SJ Semiconductor (Jiangyin) Corporation, Jianyin (CN)

( * ) Notice: Subject to any disclaimer, the term of this patent is extended or adjusted under 35 U.S.C. 154(b) by 70 days.

This patent is subject to a terminal disclaimer.

(21) Appl. No.: 16/171,239

(22) Filed: Oct. 25, 2018

(65) Prior Publication Data
US 2019/0333881 A1 Oct. 31, 2019

(30) Foreign Application Priority Data

Oct. 25, 2017 (CN) .................... 2017 1 10149586
Oct. 25, 2017 (CN) ................ 2017 2 13926337 U

(51) Int. Cl.
*H01Q 11/08* (2006.01)
*H01L 23/66* (2006.01)
(Continued)

(52) U.S. Cl.
CPC .............. *H01L 23/66* (2013.01); *H01L 21/56* (2013.01); *H01L 23/3114* (2013.01);
(Continued)

(58) Field of Classification Search
CPC . H01L 23/5226; H01L 23/3128; H01L 24/08; H01L 24/13; H01L 24/11;
(Continued)

(56) References Cited

U.S. PATENT DOCUMENTS

| 2013/0009320 | A1* | 1/2013 | Yoo | H01L 23/5226 257/774 |
| 2016/0190028 | A1* | 6/2016 | Shi | H01L 24/97 257/738 |
| 2017/0345731 | A1* | 11/2017 | Chiang | G06K 9/0002 |

FOREIGN PATENT DOCUMENTS

CN 105225965 * 1/2016

* cited by examiner

*Primary Examiner* — Awat M Salih
(74) *Attorney, Agent, or Firm* — Alston & Bird LLP

(57) ABSTRACT

The present disclosure provides a fan-out antenna packaging structure and a method for preparing the same. The fan-out antenna packaging structure comprises: a semiconductor chip; a plastic packaging material layer, comprising a first surface and a second surface opposite to the first surface, wherein the plastic packaging material layer wraps around a periphery of the semiconductor chip; a metal connecting wire disposed through the plastic packaging material layer from top to bottom; an antenna structure, located on the first surface of the plastic packaging material layer and electrically connected with the metal connecting wire; a redistribution layer, located on the second surface of the plastic packaging material layer and electrically connected with the semiconductor chip and the metal connecting wire; and a solder ball bump, located on a surface of the redistribution layer, electrically connected with the redistribution layer and insulated from the plastic packaging material layer.

5 Claims, 5 Drawing Sheets

(51) Int. Cl.
*H01L 23/522* (2006.01)
*H01L 23/00* (2006.01)
*H01Q 1/22* (2006.01)
*H01L 21/56* (2006.01)
*H01L 23/31* (2006.01)

(52) U.S. Cl.
CPC .......... *H01L 23/5226* (2013.01); *H01L 24/08* (2013.01); *H01L 24/11* (2013.01); *H01L 24/13* (2013.01); *H01Q 1/2283* (2013.01); *H01L 2223/6677* (2013.01); *H01L 2224/0231* (2013.01); *H01L 2224/02379* (2013.01); *H01L 2224/0401* (2013.01)

(58) Field of Classification Search
CPC ......... H01L 24/81; H01L 24/16; H01L 21/56; H01L 21/568; H01L 21/6835; H01L 23/3114; H01L 2224/0231; H01L 2224/0401; H01L 2224/02379; H01L 2224/13139; H01L 2224/13111; H01L 2224/13166; H01L 2224/13124; H01L 2224/13155; H01L 2224/13144; H01L 2224/81005; H01L 2224/16235; H01L 2223/6677; H01L 2223/6616; H01L 2924/15311; H01L 2924/1533; H01L 2221/68359; H01L 2221/68345; H01L 2221/68381; H01Q 1/2283; H01Q 9/27; H01Q 11/08; H01Q 11/083; H01Q 1/36

See application file for complete search history.

FAN-OUT ANTENNA PACKAGING STRUCTURE AND PREPARATION METHOD THEREOF

CROSS REFERENCES TO RELATED APPLICATIONS

This application claims the benefit of priority to Chinese Patent Application No. CN2017110149586, entitled "Fan-Out Antenna Packaging Structure and Preparation Method thereof", filed with SIPO on Oct. 25, 2017, and Chinese Patent Application No. CN2017213926337, entitled "Fan-Out Antenna Packaging Structure", filed with SIPO on Oct. 25, 2017, the contents of which are incorporated herein by reference in its entirety.

TECHNICAL FIELD

The present disclosure relates to the technical field of semiconductor packaging, and in particular, to a fan-out antenna packaging structure and a preparation method thereof.

BACKGROUND

Circuits of lower-cost, more reliable, faster and higher-density are the goal pursued by integrated circuit packaging. In the future, integrated circuit packaging will increase the integration density of various electronic components by continuously reducing the minimum feature size. At present, advanced packaging methods include Wafer Level Chip Scale Packaging (WLCSP), Fan-Out Wafer Level Packaging (FOWLP), Flip Chip (Flip Chip), Package on Package (POP), and so on.

Fan-out wafer level packaging is an embedded chip packaging method based on wafer level processing, and it is one of the advanced packaging methods with more input/output (I/O) ports and better integration flexibility. Fan-out wafer level packaging has the following unique advantages over conventional wafer level packaging: 1) I/O spacing is flexible and it is independent of chip size; 2) only effective dies are used and the product yield can be improved; 3) the 3D packaging path is flexible and patterns in any array can be formed at the top; 4) the electrical and thermal performance is better; 5) it can be applied in high frequency; and 6) it is easy to achieve high-density wiring in are distribution layer (RDL).

At present, a fan-out wafer level packaging method of radio frequency chips generally comprises the following steps: providing a carrier and forming an adhesive layer on a surface of the carrier; obtaining a redistribution layer (RDL) on the adhesive layer by performing photo-etching and electroplating; mounting the radio frequency chip on the redistribution layer by adopting a chip bonding process; packaging the chip in a plastic packaging material layer by adopting an injection molding process; removing the carrier and the adhesive layer; forming an Under-Bump Metal (UBM) layer on the redistribution layer by performing photo-etching and electroplating; performing ball placement and reflow on the UBM layer to form a solder ball bump; and then performing wafer bonding and dicing. For the sake of communication effect, antennas will be provided when the radio frequency chip is used, and for the existing radio frequency chips, antennas are directly laid out on a PCB or interfaces for connecting external antennas are provided by developers when layout design is performed for radio frequency function modules. However, due to the inconvenience in connecting the external antennas, most of the existing antennas are laid out directly on the PCB, in order to ensure the antenna gain, the size of the antennas must be large enough, and this will inevitably be at the expense of the PCB area, such that the area of the PCB and the entire packaging structure will become larger.

In view of this, it is necessary to design a new fan-out antenna packaging structure and a preparation method thereof to solve the above-mentioned technical problems.

SUMMARY

The present disclosure provides a fan-out antenna packaging structure.

The fan-out antenna packaging structure comprises: a semiconductor chip; a plastic packaging material layer, comprising a first surface and a second surface opposite to the first surface, wherein the plastic packaging material layer wraps around a periphery of the semiconductor chip; a metal connecting wire disposed through the plastic packaging material layer from top to bottom; an antenna structure, located on the first surface of the plastic packaging material layer and electrically connected with the metal connecting wire; a redistribution layer, located on the second surface of the plastic packaging material layer and electrically connected with the semiconductor chip and the metal connecting wire; and a solder ball bump, located on a surface of the redistribution layer, electrically connected with the redistribution layer and insulated from the plastic packaging material layer.

Preferably, the semiconductor chip comprises: a substrate; and a contact pad located on the substrate and electrically connected with the substrate, wherein a surface on which the contact pad is located is the front surface of the semiconductor chip.

Preferably, the metal connecting wire comprises: a connecting bump electrically connected with the redistribution layer; and a metal wire located on the connecting bump and electrically connected with the connecting bump and the antenna structure.

Preferably, the antenna structure comprises a dielectric layer and metal antennas which are alternately stacked, wherein a top layer of the antenna structure is the metal antennas, both adjacent metal antennas, and the metal antennas and the metal connecting wire are electrically connected through a metal plug.

Preferably, the antenna structure comprises a layer of metal antennas.

Preferably, the metal antennas have a shape of a spiral rectangular.

Preferably, a number of the metal antennas is more than one, wherein the more than one metal antennas are distributed in the dielectric layer.

Preferably, the redistribution layer comprises: an insulating layer located on the second surface of the plastic packaging material layer; an under-bump metal layer located in the insulating layer and electrically connected with the semiconductor chip and the metal connecting wire; and at least one metal wire layer located in the insulating layer and electrically connected with the under-bump metal layer and the solder ball bump.

Preferably, the fan-out antenna packaging structure further comprises a connecting solder ball, and the connecting solder ball is located in the plastic packaging material layer between the semiconductor chip and the redistribution layer to electrically connect the semiconductor chip with the redistribution layer.

The present disclosure further provides a method for preparing a fan-out antenna packaging structure. The method for preparing the fan-out antenna packaging structure comprises the following steps:

1) providing a carrier and forming a peeling layer on an upper surface of the carrier;
2) forming a redistribution layer on a surface of the peeling layer;
3) providing a semiconductor chip and mounting the semiconductor chip face-down on the surface of the redistribution layer;
4) forming a metal connecting wire on the surface of the redistribution layer by adopting a wire bonding process;
5) forming a plastic packaging material layer on the surface of the peeling layer, wherein the plastic packaging material layer fills a gap between the semiconductor chip and the metal connecting wire and a gap between the semiconductor chip and the redistribution layer, wherein the plastic packaging material encloses the semiconductor chip and the metal connecting wire; wherein the plastic packaging material layer comprises a first surface and a second surface opposite to the first surface, the second surface of the plastic packaging material layer is in contact with the redistribution layer, and wherein the first surface of the plastic packaging material layer exposes an upper surface of the metal connecting wire;
6) forming an antenna structure on the first surface of the plastic packaging material layer, wherein the antenna structure is electrically connected with the metal connecting wire;
7) removing the carrier and the peeling layer; and
8) forming a solder ball bump on a surface of the redistribution layer . . . wherein the solder ball bump is electrically connected with the redistribution layer and is insulated from the plastic packaging material layer.

Preferably, step 6) of forming an antenna structure on the first surface of the plastic packaging material layer comprises the following steps:

6-1) forming a first dielectric layer on the first surface of the plastic packaging material layer;
6-2) forming a first opening in the first dielectric layer, wherein the first opening exposes the upper surface of the metal connecting wire;
6-3) forming a first metal plug in the first opening and forming a first layer of metal antennas on an upper surface of the first dielectric layer, wherein the first layer of metal antennas is electrically connected with the metal connecting wire through the first metal plug;
6-4) forming a second dielectric layer on the upper surface of the first dielectric layer on which the first layer of metal antennas are formed, wherein the second dielectric layer completely covers the first layer of metal antennas;
6-5) forming a second opening in the second dielectric layer, wherein the second opening exposes part of the first layer of metal antennas; and
6-6) forming a second metal plug in the second opening, and forming a second layer of metal antennas on the second dielectric layer.

Preferably, in step 6), a method for forming an antenna structure on the first surface of the plastic packaging material layer comprises: forming a layer of metal antennas on the first surface of the plastic packaging material layer as the antenna structure.

Preferably, the metal antennas have a shape of a spiral rectangular.

Preferably, a number of the metal antennas is more than one and the more than one metal antennas are distributed in a plane of the dielectric layer.

BRIEF DESCRIPTION OF THE DRAWINGS

FIG. 2 to FIG. 14 illustrate cross sectional views of each one of the steps of the method fabricating the fan-out antenna packaging structure provided in embodiment 1 of the present disclosure, wherein FIG. 11 is a top view of the structure in FIG. 9 and FIG. 10.

FIG. 13 and FIG. 14 illustrate structural views of a fan-out antenna structure according to one embodiment of the present disclosure.

DESCRIPTION OF COMPONENT REFERENCE SIGNS

Figure 1:
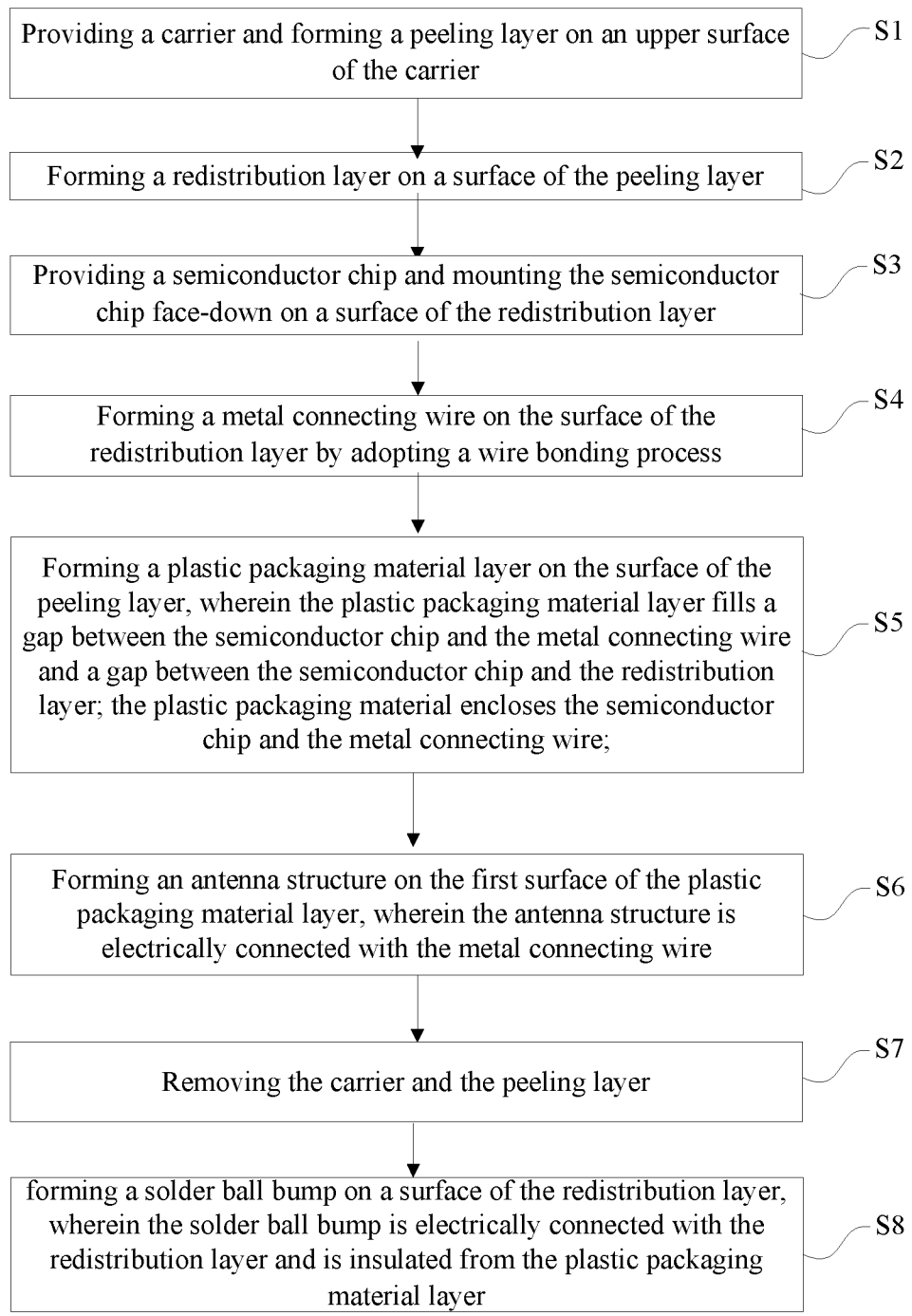
FIG. 1 illustrates a flowchart for a method for fabricating a fan-out antenna packaging structure according to embodiment 1 of the present disclosure.

10 Carrier
11 Peeling layer
12 Redistribution layer
121 Insulating layer
122 Metal wire layer
123 Under-bump metal layer
13 Semiconductor chip
131 Substrate
132 Contact pad
14 Metal connecting wire
141 Connecting bump
142 Metal wire
15 Plastic packaging material layer
16 Antenna structure
161 Dielectric layer
1611 First dielectric layer
1612 Second dielectric layer
162 Metal antenna
163 Metal plug
1631 First metal plug
1632 Second metal plug
17 Solder ball bump
18 Connecting solder ball
Steps 1)-8) Steps

DETAILED DESCRIPTION OF THE PREFERRED EMBODIMENTS

The implementation modes of the present disclosure will be described below through specific examples. One skilled in the art can easily understand other advantages and effects of the present disclosure according to content disclosed in the description. The present disclosure may also be implemented or applied through other different implementation modes, and various modifications or changes may be made to all details in the description based on different points of view and applications without departing from the spirit of the present disclosure.

Please refer to FIG. 1 to FIG. 14. It needs to be stated that the drawings provided in this embodiment are just used for schematically describing the basic concept of the present disclosure, thus only illustrate components only related to the present disclosure and are not drawn according to the numbers, shapes and sizes of components during actual implementation, the configuration, number and scale of each component during actual implementation thereof may be freely changed, and the component layout configuration thereof may be more complicated.

Embodiment 1

Referring to FIG. 1, the present disclosure provides a method for preparing a fan-out antenna packaging structure. The method comprises the following steps:

1) providing a carrier and forming a peeling layer on an upper surface of the carrier;

2) forming a redistribution layer on a surface of the peeling layer;

3) providing a semiconductor chip and mounting the semiconductor chip on a surface of the redistribution layer with a front surface of the semiconductor chip facing downward;

4) forming a metal connecting wire on the surface of the redistribution layer by adopting a wire bonding process;

5) forming a plastic packaging material layer on the surface of the peeling layer, wherein the plastic packaging material layer fills a gap between the semiconductor chip and the metal connecting wire, and a gap between the semiconductor chip and the redistribution layer, and packages the semiconductor chip and the metal connecting wire; the plastic packaging material layer comprises a first surface and a second surface, which are opposite to each other, the second surface of the plastic packaging material layer is in contact with the redistribution layer, and the first surface of the plastic packaging material layer exposes an upper surface of the metal connecting wire;

6) forming an antenna structure on the first surface of the plastic packaging material layer, wherein the antenna structure is electrically connected with the metal connecting wire;

7) removing the carrier and the peeling layer; and 8) forming a solder ball bump on a surface, insulated from the plastic packaging material layer, of the redistribution layer, wherein the solder ball bump is electrically connected with the redistribution layer.

Figure 2:
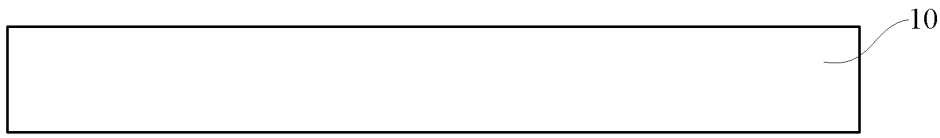
Figure 3:

In step 1), please referring to step S1 in FIG. 1 and FIG. 2 to FIG. 3, a carrier 10 is provided and a peeling layer 11 is formed on an upper surface of the carrier 10.

As an example, as illustrated in FIG. 2, a material of the carrier 10 includes but is not limited to one of silicon, glass, silicon oxide, ceramics, polymer and metal, or a composite material of more than two kinds of material thereof, the shape thereof may be a wafer shape, square shape or any other required shape. In this embodiment, the carrier 10 is used to prevent the semiconductor chip from being broken, warped and cracked during subsequent preparation.

As an example, as illustrated in FIG. 3, the peeling layer 11 acts as a separation layer between a subsequently formed redistribution layer 12 and other structures on the redistribution layer 122, and the carrier 10 in a subsequent process. The peeling layer 11 is preferably made of an adhesive material with a smooth surface, and it must have a certain binding force with the redistribution layer 12 to guarantee that the redistribution layer 122 will not move in the subsequent process. In addition, the peeling layer 11 also has a strong binding force with the carrier 10. Generally speaking, the binding force with the carrier 10 needs to be greater than that with the redistribution layer 122. As an example, the material of the peeling layer 11 is selected to be an adhesive tape with both sides having viscosity or adhesive made through a spin-coating process, etc. The adhesive tape is preferably a UV tape, which is easily torn off after being exposed to UV light. In other implementation modes, the peeling layer 11 may be other material layers formed through physical vapor deposition or chemical vapor deposition, such as epoxy, silicone rubber, polyimide (PI), polybenzoxazole (PBO) and benzocyclobutene (BCB). When the carrier 10 is subsequently separated, the peeling layer 11 can be removed by means of wet etching, chemical mechanical polishing, tearing, etc.

Figure 4:
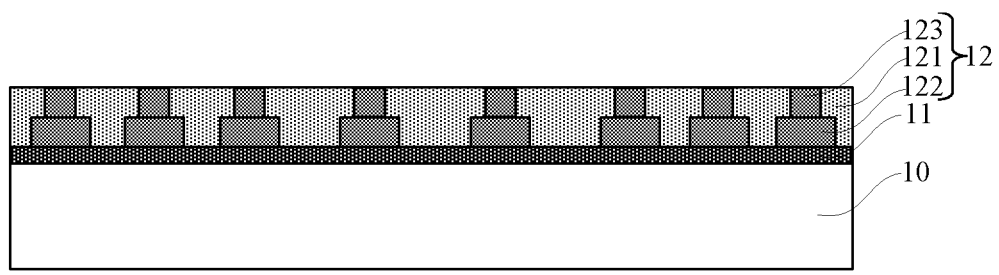

In step 2), please referring to step S2 in FIG. 1 and FIG. 4, a redistribution layer 12 is formed on a surface of the peeling layer 11.

In one example, the redistribution layer 12 comprises an insulating layer and a metal wire layer, and forming the redistribution layer 12 on the surface of the peeling layer 11 comprises the following steps:

2-1) forming the metal wire layer on the upper surface of the peeling layer 11; and 2-2) forming an insulating layer on the upper surface of the peeling layer 11, wherein the insulating layer wraps the metal wire layer.

In another example, the redistribution layer 12 comprises an insulating layer and a metal wire layer, and forming the redistribution layer 12 on the surface of the peeling layer 12 comprises the following steps:

2-1) forming the insulating layer on the upper surface of the peeling layer 11, wherein a via hole is formed in the insulating layer through photo-etching and etching processes, the via defines the shape of the metal wire layer; and 2-2) forming the metal wire layer in the via.

In another example, as illustrated in FIG. 4, the redistribution layer 12 comprises a metal wire layer 122, at least one insulating layer 121, and an under-bump metal layer 123, and forming the redistribution layer 12 on the surface of the peeling layer 11 comprises the following steps:

2-1) forming the metal wire layer 122 on the upper surface of the peeling layer 11;

2-2) forming the insulating layer 121 on the upper surface of the peeling layer 11, wherein the insulating layer 121 wraps the metal wire layer 122, the upper surface of the insulating layer 121 is higher than the upper surface of the metal wire layer 122;

2-3) forming an opening in the insulating layer 121, wherein the opening exposes the metal wire layer 122; and 2-4) forming the under-bump metal layer 123 in the opening.

In another example, as illustrated in FIG. 4, the redistribution layer 12 comprises a metal wire layer 122, at least one insulating layer 121, and an under-bump metal layer 123, and forming the redistribution layer 12 on the surface of the peeling layer 11 comprises the following steps:

2-1) forming a first insulating layer 121 on the upper surface of the peeling layer 11;

2-3) forming a first opening in the first insulating layer 121, wherein the first opening exposes part of the peeling layer 11;

2-3) forming the metal wire layer 122 in the first opening;

2-5) forming a second insulating layer 121 on the upper surface of the first insulating layer 121;

2-6) forming a second opening in the second insulating layer 121, wherein the second opening exposes the metal wire layer 122; and 2-7) forming the under-bump metal layer 123 in the second opening.

As an example, in the above-mentioned example, the material of the metal wire layer 122 may be, but is not limited to, one or a composite material of more than two of copper, aluminum, nickel, gold, silver and titanium, or a composite material formed by more than two of above mentioned materials, and the metal wire layer 122 may be formed by adopting a process such as PVD, CVD, sputtering, electroplating or electroless plating. The material of the insulating layer 121 may be a low k dielectric material.

Specifically, the material of the insulating layer 121 may include one of epoxy resin, silica gel, PI, PBO, BCB, silica, phosphorus silica glass and fluorine glass, and the insulating layer 121 may be formed by adopting processes such as spin coating, CVD and plasma enhanced CVD (PECVD).

Figure 5:
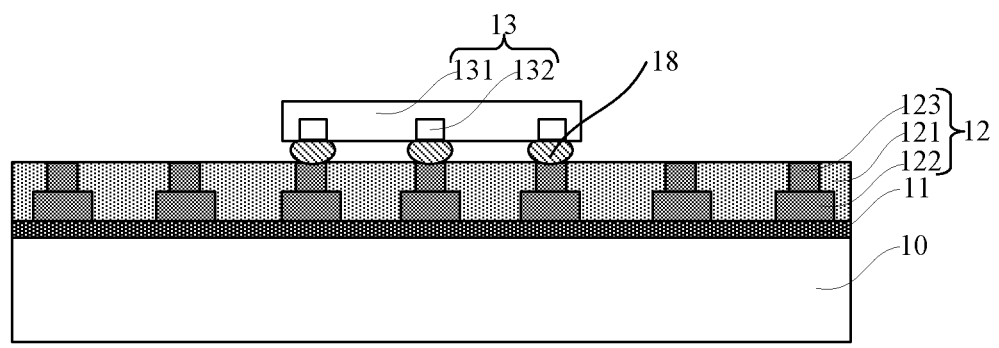

In step 3), please referring to step S3 in FIG. 1 and FIG. 5, a semiconductor chip 13 is provided and the semiconductor chip 13 is mounted on a surface of the redistribution layer 12 with a front surface of the semiconductor chip 13 facing downwards.

As an example, the semiconductor chip 13 may be any chips, such as a radio frequency chip. The semiconductor chip 13 comprises a substrate 131 and a contact pad 132, wherein the contact pad 132 is located on the substrate 131 and is electrically connected with the substrate 131; and wherein a surface on which the contact pad 132 is located is the front surface of the semiconductor chip 13.

Specifically, the semiconductor chip 13 is flip-chip welded on the redistribution layer 12 through a connecting solder ball 18, and the connecting solder ball 18 connects the contact pad 132 with the under-bump metal layer of the redistribution layer 12.

It needs to be noted that the semiconductor chip 13 may be any one of existing radio frequency communication chips for transmitting and receiving communication information. The thickness of the semiconductor chip 13 may be set according to actual needs. Preferably, in this embodiment, the thickness of the semiconductor chip 13 may be, but not limited to, 100 μm-200 μm. As an example, the material of the connecting solder ball 18 may include, but not limited to, one of aluminum, nickel, gold, silver, tin, and titanium, or an alloy of their combination thereof.

As an example, the number of the semiconductor chips 13 may be set according to actual needs, and the number of the semiconductor chips 13 mounted on the peeling layer 11 may be one, two or more.

Figure 6:
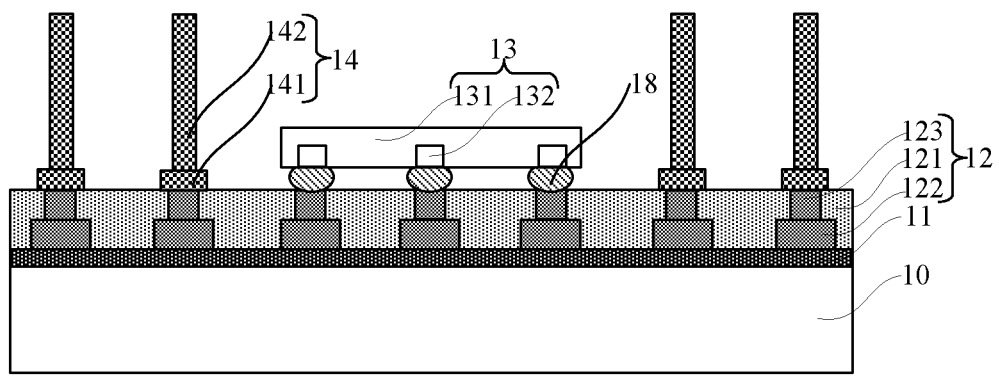

In step 4), please referring to step S4 in FIG. 1 and FIG. 6, a metal connecting wire 14 is formed on the surface of the redistribution layer 12 by adopting a wire bonding process.

As an example, forming a metal connecting wire 14 on the surface of the redistribution layer 12 by adopting a wire bonding process comprises the following steps:

4-1) forming a connecting bump 141 on the upper surface of the redistribution layer 12, wherein the connecting bump 141 is electrically connected with the under-bump metal layer 123 in the redistribution layer 12; and 4-2) forming a metal wire 142 on the upper surface of the connecting bump 141 by adopting a wire bonding process.

As an example, the metal connecting wire 14 may be, but not limited to, located on both sides of the semiconductor chip 13, and there is a distance is provided between the metal connecting wire 14 and the semiconductor chip 13. The height of the metal wire 14 is higher than the sum of the thickness of the semiconductor chip 13 and the thickness of the connecting solder ball 18. Preferably, in this embodiment, the height of the metal wire 14 may be, but not limited to, a range of 500 μm-600 μm.

As an example, the material of the connecting bump 141 and the metal wire 142 may be one of copper, aluminum, nickel, gold, silver and titanium, or a combination thereof.

Figure 7:
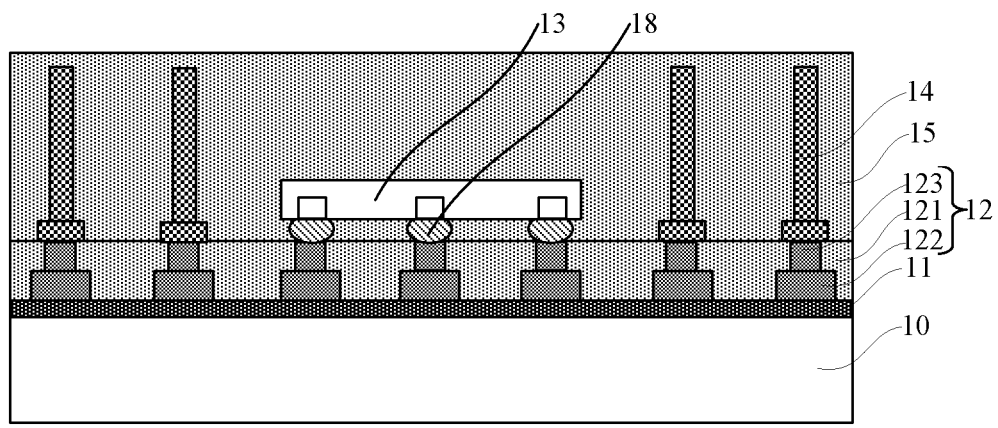
Figure 8:
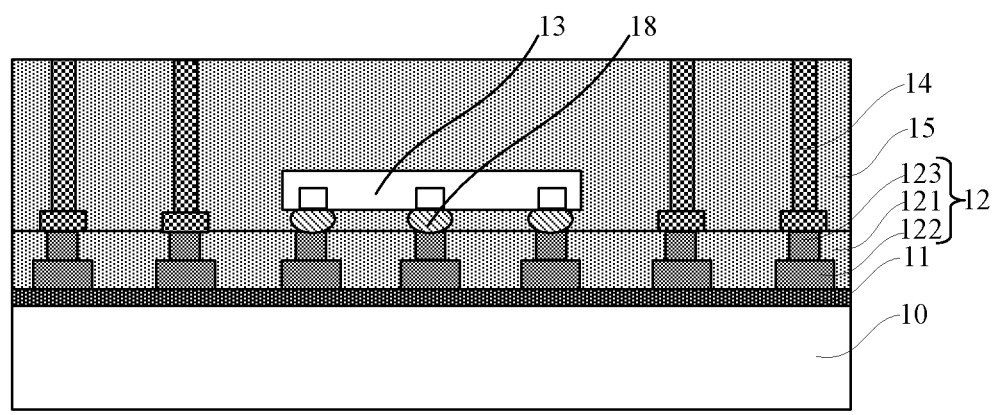

In step 5), please referring to step S5 in FIG. 1 and FIG. 7 to FIG. 8, a plastic packaging material layer 15 is formed on the surface of the peeling layer 11, and the plastic packaging material layer 15 fills a gap between the semiconductor chip 13 and the metal connecting wire 14, a gap between the semiconductor chip 13 and the redistribution layer 12, and packages the semiconductor chip 13 and the metal connecting wire 14. The plastic packaging material layer 15 comprises a first surface and a second surface opposite to the first surface, the second surface of the plastic packaging material layer 15 is in contact with the redistribution layer 12, and the first surface of the plastic packaging material layer 15 exposes an upper surface of the metal connecting wire 14.

As an example, the plastic packaging material layer 15 may be formed on the upper surface of the peeling layer 11 by adopting a compression molding, transfer molding, liquid seal molding, molding underfill, capillary underfill, vacuum laminating or spin coating process. Preferably, in this embodiment, the plastic packaging material layer 15 is formed on the upper surface of the peeling layer 11 by adopting the molding underfill process. In this way, the plastic packaging material can be smoothly and rapidly filled into the gap between the semiconductor chip 13 and the metal connecting wire 14, and the gap between the semiconductor chip 13 and the redistribution layer 12, thus interfacial de-lamination can be effectively avoided, the molding underfill will not be restricted like the capillary underfill process in the prior art, the process difficulty is greatly reduced, and it can be used for smaller connection gaps and is more suitable for stack structures.

As an example, the material of the plastic packaging material layer 15 may be, but is not limited to, a polyimide layer, a silica gel layer, an epoxy resin layer, a curable polymer-based material layer, or a curable resin-based material layer.

In one example, firstly the plastic packaging material layer 15 is formed on the upper surface of the peeling layer 11, and the plastic packaging material layer 15 completely packages the semiconductor chip 13 and the metal connecting wire 14, that is, the first surface of the plastic packaging material layer 15 is higher than the upper surface of the metal connecting wire 14, as illustrated in FIG. 7. Then part of the plastic packaging material layer 15 is removed by adopting processes such as chemical mechanical polishing, such that the first surface of the plastic packaging material layer 15 is level with the upper surface of the metal connecting wire 14, as illustrated in FIG. 8.

In another example, the plastic packaging material layer 15 may be formed according to the height of the metal connecting wire 14 such that the height of the formed plastic packaging material layer 15 is exactly the same as the height of the metal connecting wire 14, in other words, the first surface of the plastic packaging material layer 15 is level with the upper surface of the metal connecting wire 14. In this way, the step of grinding the plastic packaging material layer 15 can be omitted, thereby simplifying the process steps.

In step 6), please referring to step S6 in FIG. 1 and FIG. 9 to FIG. 11, an antenna structure 16 is formed on the first surface of the plastic packaging material layer 15, and the antenna structure 16 is electrically connected with the metal connecting wire 14.

Figure 9:
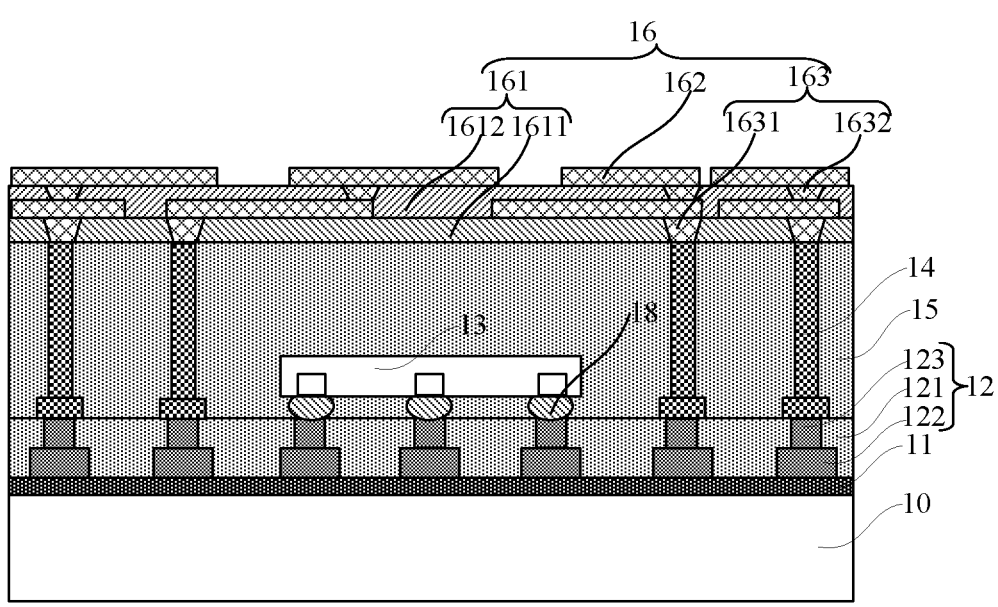

In one example, as illustrated in FIG. 9, the step of forming an antenna structure 16 on the first surface of the plastic packaging material layer 15 comprises the following steps:

6-1) forming a first dielectric layer 1611 on the first surface of the plastic packaging material layer 15;

6-2) forming a first opening (not shown) in the first dielectric layer 1611, wherein the first opening exposes the upper surface of the metal connecting wire 14;

6-3) forming a first metal plug 1631 in the first opening and forming a first layer of metal antennas 162 on an upper surface of the first dielectric layer 1611, wherein the first layer of metal antennas 162 is electrically connected with the metal connecting wire 14 through the first metal plug 1611;

6-4) forming a second dielectric layer 1612 on the upper surface of the first dielectric layer 1611 on which the first layer of metal antennas 162 are formed, wherein the second dielectric layer 1612 completely covers the first layer of metal antennas 162; and the first dielectric layer 1611 and the second dielectric layer 1612 jointly forming the dielectric layer 161;

6-5) forming a second opening (not shown) in the second dielectric layer 1612, wherein the second opening exposes part of the first layer of metal antennas 162; and 6-6) forming a second metal plug 1632 in the second opening and forming a second layer of metal antennas 162 on the second dielectric layer 1612; wherein the first metal plug 1631 and the second metal plug 1632 jointly form the metal plug 163.

Figure 10:
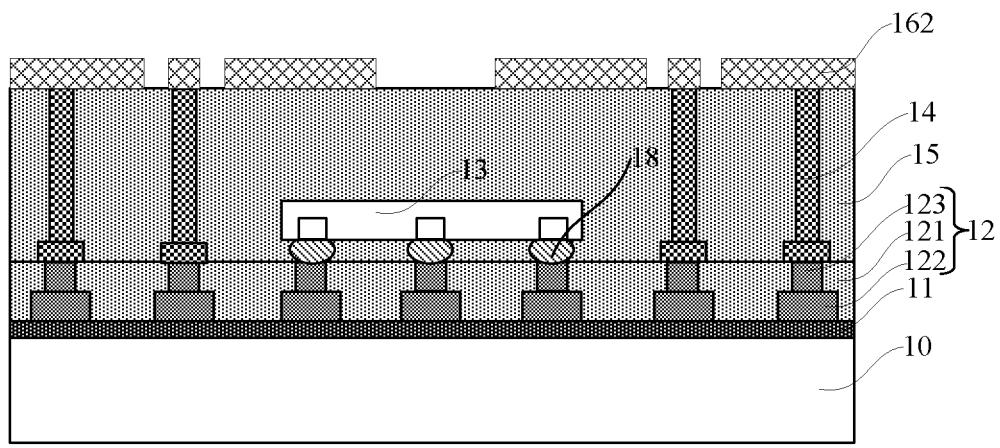

In another example, as shown in FIG. 10, a layer of metal antennas 162 may be formed on the first surface of the plastic packaging material layer 15 as the antenna structure 16.

As an example, the shape of the metal antenna 162 may be set according to actual needs. Preferably, in this embodiment, the metal antennas 162 may be, but not limited to, spirally rectangular. Of course, in other examples, the metal antennas 162 may also be in any other shapes, such as spirally circular shape or bow shape.

As an example, the material of the dielectric layer 161 may include, but not limited to, silicon dioxide or PET (polyethylene terephthalate), and is prepared by adopting processes such as spin coating, chemical vapor deposition (CVD) and plasma enhanced chemical vapor deposition (PECVD). The material of the metal antennas 162 and the metal plug 163 may include, but not limited to, one or more of copper, aluminum, nickel, gold, silver, tin, and titanium, wherein the metal antennas 162 and the metal plug 163 may be prepared by adopting one of physical vapor deposition (PVD), chemical vapor deposition (CVD), sputtering, electroplating, and electroless plating.

As an example, the thickness of the first dielectric layer 1611 may be, but not limited to, 10 μm-15 μm, the thickness of the second dielectric layer 1612 may be, but not limited to, 10 μm-15 μm, and the thickness of the metal antennas 162 may be 5 μm-10 μm.

Figure 11:
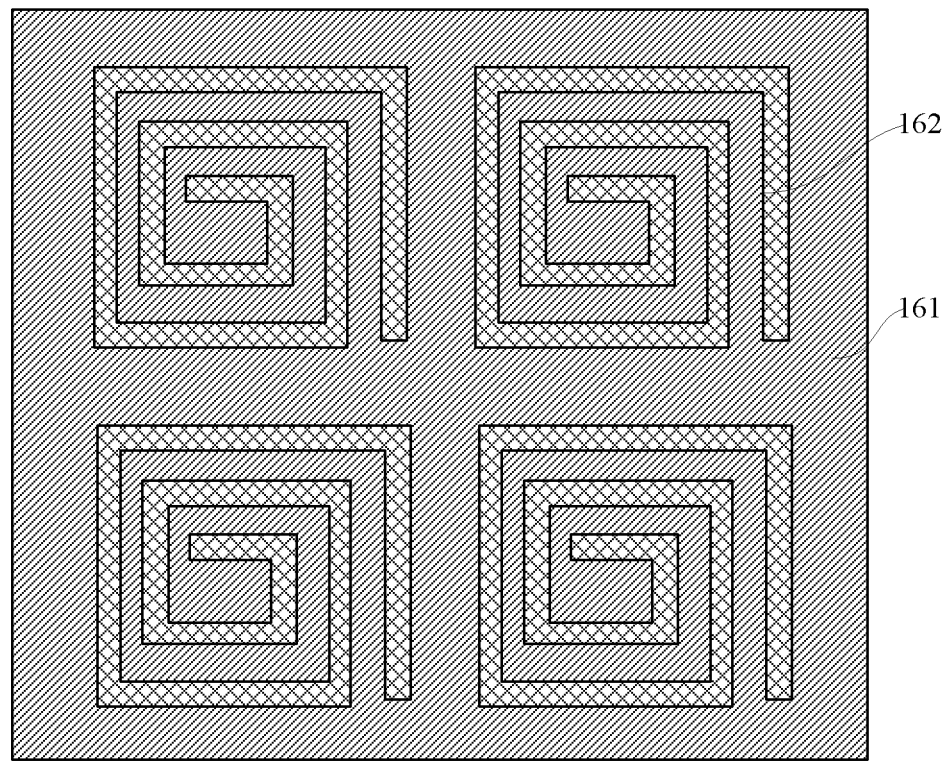

As an example, the number of the metal antennas 162 on each layer may be set according to actual needs. Preferably, in this embodiment, the number of the metal antennas 162 on each layer is more than one, and the more than one metal antennas 162 are distributed in an array along an extending direction of the surface of the dielectric layer 161, wherein FIG. 11 illustrates an example that the number of the metal antenna 162 is four. Of course, in other examples, the number of the metal antennas 162 on each layer may be set to one, two, three, five or more, and so on, according to actual needs. It should be noted that, in other examples, the number of the metal antennas 162 on the first layer may be the same as or different from that on the second layer, for example, the number of the metal antennas 162 on the first layer and the number of the metal antennas 162 on the second layer may both be four, or the number of the metal antennas 162 on the first layer is one, the number of the metal antennas 162 on the second layer is four, and so on.

It should be further noted that, when the number of the semiconductor chip 13 is one, one metal antenna 162 corresponding thereto from top to bottom may be provided on each layer of metal antennas 162 above the semiconductor chip 13, or more than one metal antennas 162 may also be provided on each layer of metal antennas 162 above the semiconductor chip 13. When the number of the semiconductor chips 13 is two or more, one metal antenna 162 may be provided on each layer of the metal antennas 162 above the semiconductor chip 13, or more than one metal antennas 162 may also be provided on each layer of metal antennas 162 above the semiconductor chip 13, and each of the metal antennas 162 on each layer of metal antennas 162 is in one-to-one correspondence to the semiconductor chips 13.

According to the present disclosure, by forming the antenna structure 16 on the first surface of the plastic packaging material layer 15, the antenna structure 16 is located above the semiconductor chip 13, thus the space area can be greatly reduced, and the size of the packaging structure can be smaller. The metal antennas 162 in the antenna structure 16 adopt a stack and spiral structure, antennas with large area and length can be formed in a small area, the antenna gain is greatly improved, and which cannot only can guarantee the stability of the radio frequency chip, but also improve the communication distance. The metal antennas 162 in the antenna structure 16 may be prepared by adopting a dry etching process, the antenna width thereof can be very small, and the density of the metal antennas 162 in the antenna structure 16 can be greatly increased; and the packaging structure provided by the present disclosure has better integration.

Figure 12:
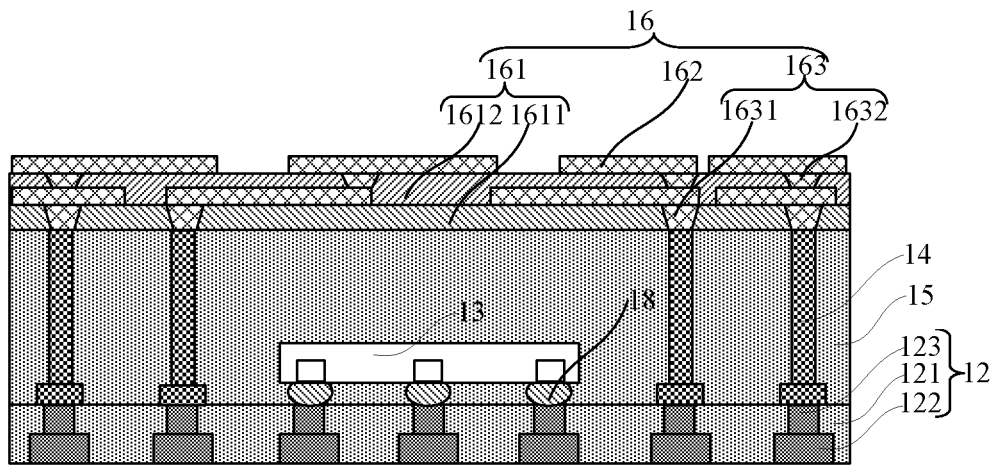

In step 7), please referring to step S7 in FIG. 1 and FIG. 12, the carrier 10 and the peeling layer 11 are removed.

As an example, the carrier 10 and the peeling layer 11 may be removed by adopting a grinding process, a thinning process, etc. Preferably, in this embodiment, the carrier 10 is removed by tearing off the peeling layer 11.

Figure 13:
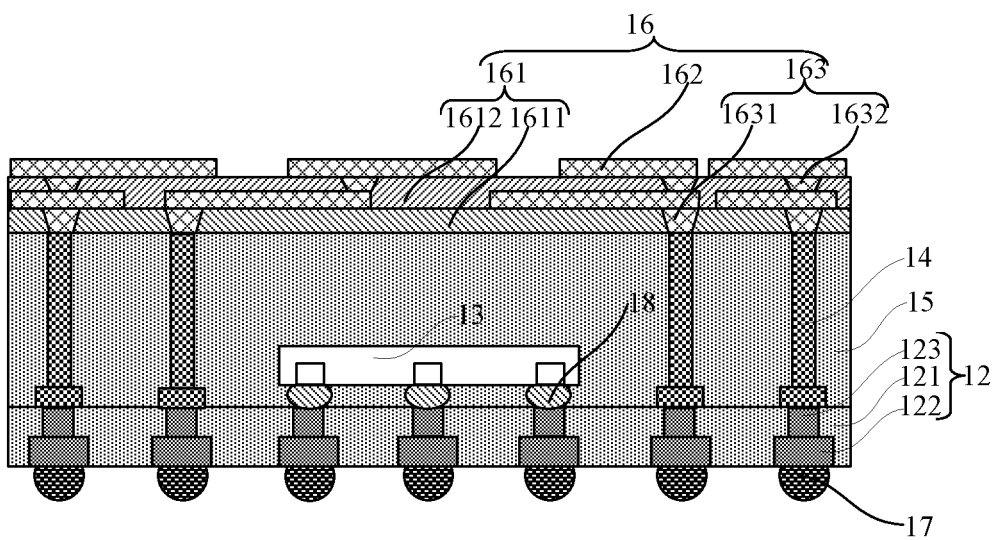
Figure 14:
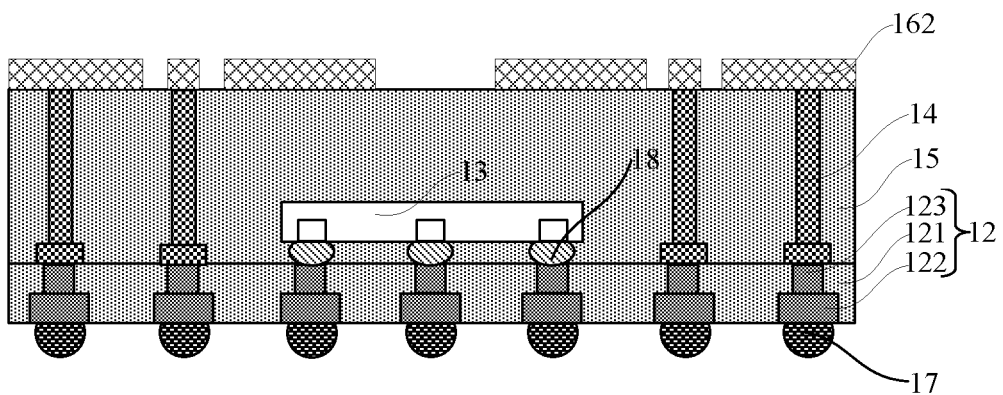

In step 8), please referring to step S8 in FIG. 1 and FIG. 13 and FIG. 14, a solder ball bump 17 is formed on a surface, insulated from the plastic packaging material layer 15, of the redistribution layer 12, and the solder ball bump 17 are electrically connected with the redistribution layer 12.

In one example, forming a solder ball bump 17 on a surface, insulated from the plastic packaging material layer 15, of the redistribution layer 12 comprises the following steps:

8-1) forming a metal pole (not shown) on the surface, insulated from the plastic packaging material layer 15, of the redistribution layer 12, wherein the metal pole is electrically connected with the metal wire layer 122 in the redistribution layer 12; and 8-2) forming a solder ball on the surface, insulated from the rewiring layer 12, of the metal pole.

As an example, the material of the metal pole may be one of copper, aluminum, nickel, gold, silver and titanium, or a combination thereof, and the metal pole may be formed by adopting any one of processes such as physical vapor deposition (PVD), chemical vapor deposition (CVD), sputtering, electroplating and electroless plating. The material of the sold ball may be one of copper, aluminum, nickel, gold, silver and titanium, or a combination thereof, and the sold ball may be formed by adopting a ball placement and reflow process.

In another example, as illustrated in FIGS. 13 and 14, the solder ball bump 17 is a solder ball, which can be directly formed as the solder ball bump 17 by adopting a ball placement and reflow process. The solder ball bump 17 is directly connected with the metal wire layer 122 in the redistribution layer 12. As an example, the height of the solder ball bump 17 may be, but not limited to, 190 μm.

Embodiment 2

Please refer to FIG. 13 and FIG. 14. This embodiment provides a fan-out antenna packaging structure. The fan-out antenna packaging structure comprises: a semiconductor chip 13; a plastic packaging material layer 15, wherein the plastic packaging material layer 15 comprises a first surface and a second surface which are opposite to each other, the plastic packaging material layer 15 packages a periphery of the semiconductor chip; a metal connecting wire 14 located in the plastic packaging material layer 15 and running through the plastic packaging material layer 15 from top to bottom; an antenna structure 16 located on the first surface of the plastic packaging material layer 15 and electrically connected with the metal connecting wire 14; a redistribution layer 12 located on the second surface of the plastic packaging material layer 15 and electrically connected with the semiconductor chip 13 and the metal connecting wire 14; and a solder ball bump 17 located on a surface, insulated from the plastic packaging material layer 15, of the redistribution layer, and electrically connected with the redistribution layer 12.

As an example, the semiconductor chip 13 may be any chip, such as a radio frequency chip. The semiconductor chip 13 comprises a substrate 131 and a contact pad 132, wherein the contact pad 132 is located on the substrate 131 and is electrically connected with the substrate 131, wherein a surface on which the contact pad 132 is located is the front surface of the semiconductor chip 13.

As an example, the material of the plastic packaging material layer 15 may be, but is not limited to, a polyimide layer, a silica gel layer, an epoxy resin layer, a curable polymer-based material layer, or a curable resin-based material layer.

As an example, the fan-out antenna packaging structure further comprises a connecting solder ball 18, the connecting solder ball 18 is located in the plastic packaging material layer 15 and is located between the semiconductor chip 13 and the redistribution layer 12 to electrically connect the semiconductor chip 13 with the redistribution layer 12, the semiconductor chip 13 is flip-chip welded on the redistribution layer 12 through the connecting solder ball 18, and the connecting solder ball 18 connects the contact pad 132 with the under-bump metal layer of the redistribution layer 12.

It needs to be noted that the semiconductor chip 13 may be any existing radio frequency communication chip for transmitting and receiving communication information. The thickness of the semiconductor chip 13 may be set according to actual needs. Preferably, in this embodiment, the thickness of the semiconductor chip 13 may be, but not limited to, 100 μm-200 μm. As an example, the material of the connecting solder ball 18 may include, but not limited to, one of aluminum, nickel, gold, silver, tin, and titanium, or a combination thereof.

As an example, the number of the semiconductor chips 13 may be set according to actual needs, and the number of the semiconductor chips 13 mounted on the peeling layer 11 may be one, two or more.

As an example, the metal connecting wire 14 comprises: a connecting bump 141 electrically connected with the redistribution layer 12; and a metal wire 142 located on the connecting bump 141, wherein the metal wire 142 is electrically connected with the connecting bump 141 and the antenna structure 16.

As an example, the material of the connecting bump 141 and the metal wire 142 may be one of copper, aluminum, nickel, gold, silver and titanium, or a combination thereof.

As an example, the upper surface of the metal connecting wire 14 is level with the first surface of the plastic packaging material layer 15.

In one example, as illustrated in FIG. 13, the antenna structure 16 comprises a dielectric layer 161 and metal antennas 162 which are alternately stacked, a top layer of the antenna structure 16 is the metal antennas 162, and both the adjacent metal antennas 162, and the metal antennas 162 and the metal connecting wire 162 are electrically connected through a metal plug 163. Herein, FIG. 12 illustrates an example that the dielectric layer 161 comprises two layers (i.e., comprising a first dielectric layer 1611 and a second dielectric layer 1622 in FIG. 13), and the metal antennas 162 also comprise two layers.

In another example, as illustrated in FIG. 14, the antenna structure 16 may also comprise only one layer of metal antennas 162.

As an example, the shape of the metal antenna 162 may be set according to actual needs. Preferably, in this embodiment, the metal antennas 162 may be, but not limited to, spirally rectangular. Of course, in other examples, the metal antennas 162 may be other shape, such as spiral circular shape or bow shape.

As an example, the material of the dielectric layer 161 may include, but not limited to, silicon dioxide or PET (polyethylene terephthalate), and is prepared by adopting processes such as spin coating, chemical vapor deposition (CVD) and plasma enhanced chemical vapor deposition (PECVD). The material of the metal antennas 162 and the metal plug 163 may include, but not limited to, one or more of copper, aluminum, nickel, gold, silver, tin, and titanium, wherein the metal antennas 162 and the metal plug 163 may be prepared by adopting one of physical vapor deposition (PVD), chemical vapor deposition (CVD), sputtering, electroplating, and electroless plating.

As an example, the thickness of the first dielectric layer 1611 may be, but not limited to, 10 μm-15 μm, the thickness of the second dielectric layer 1612 may be, but not limited to, 10 μm-15 μm, and the thickness of the metal antennas 162 may be 5 μm-10 μm.

As an example, the number of the metal antennas 162 on each layer may be set according to actual needs. Preferably, in this embodiment, the number of the metal antennas 162 on each layer is more than one, and the more than one metal antennas 162 are distributed in an array along an extending direction of the surface of the dielectric layer 161. Wherein, FIG. 11 illustrates an example that the number of the metal antenna 162 is four. Of course, in other examples, the number of the metal antennas 162 on each layer may also be set to one, two, three, five or more, and so on, according to actual needs. It needs to be noted that, in other examples, the number of the metal antennas 162 on the first layer may be the same as or different from that on the second layer. For example, the number of the metal antennas 162 on the first layer and the number of the metal antennas 162 on the second layer may be four, or the number of the metal antennas 162 on the first layer is one, the number of the metal antennas 162 on the second layer is four, and so on.

It needs to be further noted that, when the number of the semiconductor chip 13 is one, one metal antenna 162 corresponding thereto from top to bottom may be provided on each layer of metal antennas 162 above the semiconductor chip 13, and more than one metal antennas 162 may also be provided on each layer of metal antennas 162 above the semiconductor chip 13. When the number of the semiconductor chips 13 is two or more, one metal antenna 162 may be provided on each layer of the metal antennas 162 above the semiconductor chip 13, more than one metal antennas 162 may also be provided on each layer of metal antennas 162 above the semiconductor chip 13, and each of the metal antennas 162 on each layer of metal antennas 162 is in one-to-one correspondence to each of the semiconductor chips 13.

According to the present disclosure, by forming the antenna structure 16 on the first surface of the plastic packaging material layer 15, the antenna structure 16 is located above the semiconductor chip 13, thus the space area can be greatly reduced, and the size of the packaging structure can be smaller. The metal antennas 162 in the antenna structure 16 adopt a stack and spiral structure, antennas with large area and length can be formed in a small area, the antenna gain is greatly improved, and not only can the stability of the radio frequency chip be guaranteed, but also the communication distance is improved. The metal antennas 162 in the antenna structure 16 may be prepared by adopting a dry etching process, the antenna width thereof can be very small, and the density of the metal antennas 162 in the antenna structure 16 can be greatly increased. The packaging structure provided by the present disclosure has better integration.

As an example, the redistribution layer 12 comprises: an insulating layer 121 located on the second surface of the plastic packaging material layer 15; an under-bump metal layer 123 located in the insulating layer 121 and electrically connected with the semiconductor chip 13 and the metal connecting wire 14; and at least one metal wire layer 122 located in the insulating layer 121 and electrically connected with the under-bump metal layer 123 and the solder ball bump 17. As an example, the height of the solder ball bump 17 may be, but not limited to, about 190 μm.

To sum up, the present disclosure provides a fan-out antenna packaging structure and a method for preparing the same. The fan-out antenna packaging structure comprises: a semiconductor chip; a plastic packaging material layer comprising a first surface and a second surface which are opposite to each other, wherein the plastic packaging material layer packaging packages a periphery of the semiconductor chip; a metal connecting wire located in the plastic packaging material layer and running through the plastic packaging material layer from top to bottom; an antenna structure located on the first surface of the plastic packaging material layer and electrically connected with the metal connecting wire; redistribution layer located on the second surface of the plastic packaging material layer and electrically connected with the semiconductor chip and the metal connecting wire; and a solder ball bump located on a surface, insulated from the plastic packaging material layer, of the redistribution layer, and electrically connected with the redistribution layer.

In the present disclosure, by forming the antenna structure on the first surface of the plastic packaging material layer, the antenna structure is located above the semiconductor chip, thus the space area can be greatly reduced, and the size of the packaging structure can be smaller. The metal antennas in the antenna structure in the present disclosure adopt a stack and spiral structure, antennas with large area and length can be formed in a small area, the antenna gain is greatly improved, which can not only guarantee the stability of the radio frequency chip, but also improve the communication distance. The antenna width of the metal antennas in the antenna structure in the present disclosure can be very small, and the density of the metal antennas in the antenna structure can be greatly increased. The packaging structure provided by the present disclosure has better integration. By forming the antennas in the packaging structure of the radio frequency chip in the present disclosure, it is unnecessary to lay out the antennas in the subsequent application, the problem that the area of the PCB is increased in order to ensure the antenna gain when the existing radio frequency chip is used is solved, and not only can the antenna gain of the radio frequency chip be guaranteed to be large enough, but also the area of the PCB board is guaranteed to be small enough.

The above-mentioned embodiments are only used for exemplarily describing the principle and effects of the present disclosure instead of limiting the present disclosure. One skilled in the art may make modifications or changes to the above-mentioned embodiments without departing from the spirit and scope of the present disclosure. Therefore, all equivalent modifications or changes made by those who have common knowledge in the art without departing from the spirit and technical thought disclosed by the present disclosure shall be still covered by the claims of the present disclosure.

The invention claimed is:

1. A method for preparing a fan-out antenna packaging structure, comprising the following steps:
   1) providing a carrier and forming a peeling layer on an upper surface of the carrier;
   2) forming a redistribution layer on a surface of the peeling layer;
   3) providing a semiconductor chip and mounting the semiconductor chip face-down on a surface of the redistribution layer;
   4) forming a metal connecting wire on the surface of the redistribution layer by adopting a wire bonding process;
   5) forming a plastic packaging material layer on the surface of the peeling layer, wherein the plastic packaging material layer fills a gap between the semiconductor chip and the metal connecting wire and a gap between the semiconductor chip and the redistribution layer; wherein the plastic packaging material encloses the semiconductor chip and the metal connecting wire; wherein the plastic packaging material layer comprises a first surface and a second surface opposite to each other, wherein the second surface of the plastic packaging material layer is in contact with the redistribution layer, and wherein the first surface of the plastic packaging material layer exposes an upper surface of the metal connecting wire;
   6) forming an antenna structure on the first surface of the plastic packaging material layer, wherein the antenna structure is electrically connected with the metal connecting wire;
   wherein forming an antenna structure on the first surface of the plastic packaging material layer comprises the following steps:
   6-1) forming a first dielectric layer on the first surface of the plastic packaging material layer;
   6-2) forming a first opening in the first dielectric layer, wherein the first opening exposes the upper surface of the metal connecting wire;
   6-3) forming a first metal plug in the first opening and forming a first layer of metal antennas on an upper surface of the first dielectric layer, wherein the first layer of metal antennas is electrically connected with the metal connecting wire through the first metal plug;

6-4) forming a second dielectric layer on the upper surface of the first dielectric layer on which the first layer of metal antennas are formed, wherein the second dielectric layer completely covers the first layer of metal antennas;

6-5) forming a second opening in the second dielectric layer, wherein the second opening exposes part of the first layer of metal antennas; and 6-6) forming a second metal plug in the second opening, and forming a second layer of metal antennas on the second dielectric layer;

7) removing the carrier and the peeling layer; and 8) forming a solder ball bump on a surface of the redistribution layer, wherein the solder ball bump is electrically connected with the redistribution layer and is insulated from the plastic packaging material layer.

2. The method for preparing the fan-out antenna packaging structure according to claim 1, characterized in that, in step 6), the method for forming an antenna structure on the first surface of the plastic packaging material layer comprises: forming the layer of metal antennas on the first surface of the plastic packaging material layer as the antenna structure.

3. The method for preparing the fan-out antenna packaging structure according to claim 2, characterized in that the metal antennas have a shape of a spiral rectangular.

4. The method for preparing the fan-out antenna packaging structure according to claim 1, characterized in that the metal antennas have a shape of a spiral rectangular.

5. The method for preparing the fan-out antenna packaging structure according to claim 4, characterized in that a number of the metal antennas is more than one and the more than one metal antennas are distributed in the plane of the dielectric layers.

* * * * *